United States Patent [19]

Ferrer

[11] Patent Number: 4,885,550
[45] Date of Patent: Dec. 5, 1989

[54] SIGNAL INPUT TO DIFFERENTIAL OUTPUT AMPLIFIER

[75] Inventor: Enrique Ferrer, Miami, Fla.

[73] Assignee: Motorola, Inc., Schaumburg, Ill.

[21] Appl. No.: 278,381

[22] Filed: Dec. 1, 1988

[51] Int. Cl.[4] .............................. H03F 3/68; H03F 3/16
[52] U.S. Cl. ..................................... 330/301; 330/295; 330/277
[58] Field of Search ............... 330/116, 117, 275, 277, 330/295, 296, 301, 84, 124 R

[56]        References Cited
        U.S. PATENT DOCUMENTS 3,863,168  1/1975  Beurrier ............................. 330/295
4,558,186 12/1985  Stahl ................................. 330/301 X

FOREIGN PATENT DOCUMENTS 0068142  6/1979  Japan ................................... 330/301

Primary Examiner—Steven Mottola
Attorney, Agent, or Firm—Robert S. Babayi; Daniel K. Nichols

[57]            ABSTRACT

A single input, differential output amplifier (50) includes two Gallium Arsenide field effect transistors: one arranged to form a common gate amplifier (55) to provide a non-inventing output (60), and the other arranged to form a common source (65) amplifier to provide an inverting output (61). The input of each FET is connected to receive an input signal simultaneously thereby minimizing phase delay in the differential output signals. In another aspect of the invention, the non-inverting stage (55) is incorporated into the biasing network for the inverting amplifier (65).

8 Claims, 1 Drawing Sheet

SIGNAL INPUT TO DIFFERENTIAL OUTPUT AMPLIFIER

BACKGROUND OF THE INVENTION

This invention relates generally to amplifier circuits and more particularly to those amplifier circuits that accept a single input and provide differential outputs (i.e., outputs being 180° out of phase). In radio frequency (RF) applications, such as a balanced mixer, it is often required to drive local oscillator input, RF input or both inputs differentially. It is therefore necessary to reduce phase error between the differential outputs of the amplifier in order to minimize intermodulation distortion. Furthermore, it is important for the amplifier to present a low input impedance for broadband applications as well as ease matching the amplifier input to a desired impedance.

As shown in FIG. 1, a conventional differential amplifier 10 has an input 23 coupled to ground. Conceptually this circuit consists of a common source field effect transistor (FET) 15 and a common gate FET 19. An input signal applied at input 11 appears 180° out-of-phase at output 16 (i.e., the inverting output) and in-phase at junction 18. The signal at junction 18 acts as an input to the common gate FET 19, which results in an in-phase signal at an output 20 (i.e., the non-inverting output).

A major disadvantage of the amplifier 10 is that a phase error develops between the two outputs 16 and 20 due to a delay associated with the input signal at junction 13 having to progress through the FET 15 before it reaches the source (i.e., the input) of FET 19. Additionally the amplifier 10 suffers from a narrow operational bandwidth due to its high input impedance. Another disadvantage of the amplifier 10 is the necessity of providing a constant current source 22 to maintain identical amplitudes at outputs 16 and 20.

SUMMARY OF THE INVENTION

It is an object of this invention to provide a single input to differential output amplifier having improved phase error between differential outputs of the amplifier.

It is another objective of the invention to provide a single input to differential output amplifier having lower input impedance to facilitate impedance matching of the amplifier's input port and to insure wider operational bandwidth.

Briefly, according to the invention, a single input, differential output amplifier preferably comprises two FETs: one arranged to form a common gate amplifier to provide a noninverting output, and a second FET arranged to form a common source amplifier to provide an inverting output. The input of each FET is connected to receive an input signal simultaneously, thereby minimizing phase delay in the differential output signals. In another aspect of the invention, the non-inverting amplifier is incorporated into the biasing network for the inverting amplifier.

DESCRIPTION OF THE PREFERRED EMBODIMENT

Figure 1:
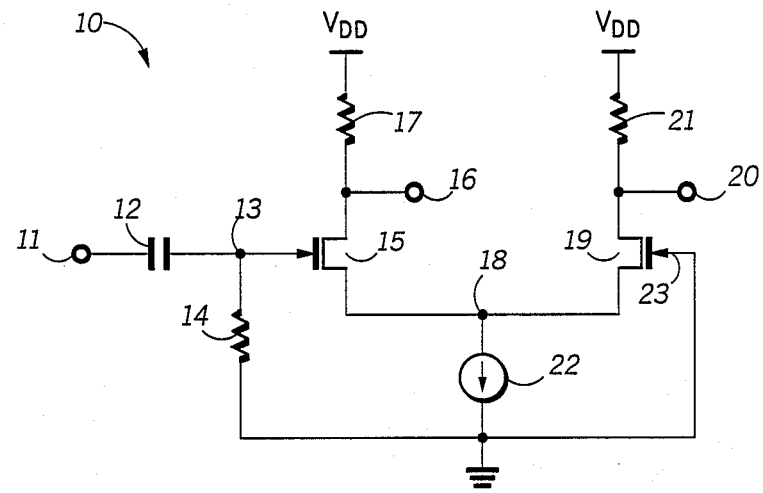
FIG. 1 is an electrical schematic of a single input-to-differential output amplifier in accordance with the prior art.
Figure 2:
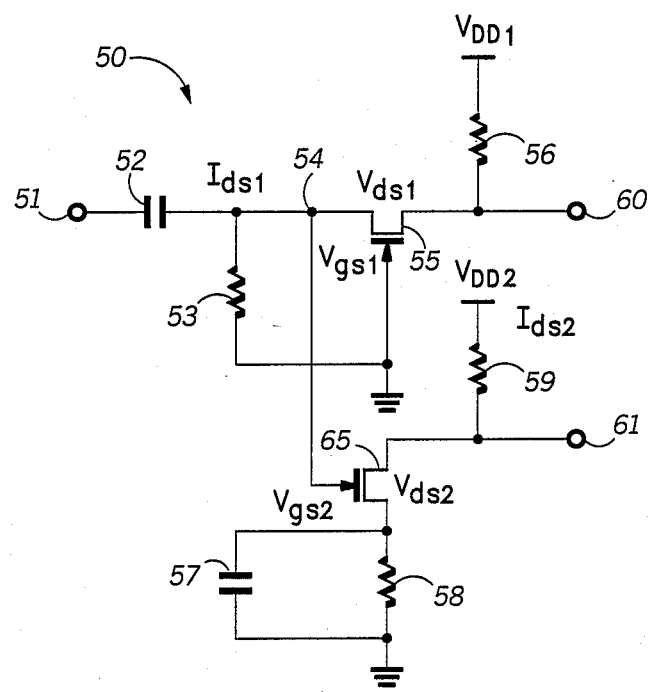
FIG. 2 is an electrical schematic of a single input-to-differential output amplifier in accordance with the present invention.

Referring to FIG. 2, the preferred differential output amplifier 50 includes two depletion type Gallium Arsenide (GaAs) FETs 55 and 65. An input signal is received at node 51 and applied through a coupling capacitor 52 to the source of the FET 55. A biasing voltage Vdd1 is connected to the drain of FET 55 by a resistor 56; the junction thereof providing a non-inverting output 60. A resistor 53 is connected between the source of FET 55 and ground, which provides a biasing potential Vgs1 for the common gate FET 55. The source of the FET 55 is also connected to the gate of a second FET 65 at junction 54. Biasing voltage Vdd2 is connected to the drain of FET 65 via a resistor 59; the junction thereof providing a inverting output 61. Resistor 58 connects the source of the FET 65 to ground, and in combination with Vgs1, provides a biasing potential Vgs2 for the gate-to-source junction of the FET 65. A capacitor 57 is also coupled between the source of the FET 65 and ground to provide an AC ground at the source. As seen from FIG. 2, the second FET 65 constitutes an inverting common source stage for the amplifier 50.

In the arrangement of the present invention, the common gate stage of FET 55 is an integral part of the biasing network for the common source stage of FET 65. For proper biasing, the quiescent point of the FETs 65 and 55 should be identical. Accordingly, the voltages Vds1 and Vds2 are preferably equal. Additionally, the gate-to-source junction potentials Vgs1 and Vgs2 and currents Ids1 and Ids2 of the FETs must also be identical. In order to have identical gate-to-source voltages, the value of resistor 58 must be twice that of resistor 53. The resistors 56 and 59 are preferably of equal value and selected for the required voltage gain, and to keep FETs 65 and 55 in the saturation region. Since resistors 58 and 53 are not equal, the bias voltage Vdd2 is greater than Vdd1 in order to maintain equal drain to source voltages for both FETs. This can be accomplished by using a single supply in conjunction with a common voltage divider network (not shown).

In operation, the input signal will appear simultaneously at the input of the inverting stage of (FET 65) and the input of the non-inverting stage (FET 55), thereby minimizing phase error between the output signals.

The amplifier 50 also presents an equal, and low, input impedance for both stages since the inputs of the common gate FET 55 and the common source FET 65 are coupled together. This further reduces phase error, and increases the operational bandwidth.

Another advantage of the amplifier 50 is the elimination of constant current source circuitry 22, which is required by conventional differential amplifier 10. Of course, the present invention is not limited to GaAs FETs, and, if desired, other transistor types, such as, bipolar transistors or CMOS FETs may be utilized.

We claim as our invention:
1. A single input, differential output amplifier having reduced phase error, comprising:
an inverting stage for driving an independent load including an input port, an output port, and an inverting transistor, a non-inverting stage for driving another independent load, including an input port, an output port, and a non-inverting transistor, said input port of said inverting stage being coupled to said input port of said non-inverting stage for simultaneously receiving an input signal.

2. A single input, differential output as defined in claim 1, in which said inverting transistor comprises an inverting FET and said non-inverting transistor comprises a non-inverting FET.

3. A single input, differential output amplifier, comprising:
an inverting stage having an input port and an output port,
a non-inverting stage having an input port and an output port, said input port of said inverting stage being coupled to said input port of said noninverting stage for simultaneously receiving an input signal,
said inverting stage and said non-inverting stage each includes a FET, said FET of said non-inverting stage being arranged in a common gate configuration.

4. A single input, differential output amplifier, comprising:
an inverting stage having an input port and an output port,
a non-inverting stage having an input port and an output port, said input port of said inverting stage being coupled to said input port of said noninverting stage for simultaneously receiving an input signal,
said inverting stage and said non-inverting stage each includes a FET, said FET of said inverting stage being arranged in a common source configuration.

5. A single input, differential output amplifier, comprising:
an inverting stage having an input port and an output port,
a non-inverting stage having an input port and an output port, said input port of said inverting stage being coupled to said input port of said noninverting stage for simultaneously receiving an input signal,
said inverting stage and said non-inverting stage each includes a FET, said FET of said non-inverting stage being arranged in a common gate configuration, and said FET of said inverting stage being arranged in a common source configuration.

6. In a single input, differential output amplifier, driving independent loads, a method for reducing phase error comprising the steps of:
(a) providing a non-inverting stage having an input port, an output port, and a non-inverting transistor,
(b) providing an inverting stage having an input port, an output port, and an inverting transistor,
(c) coupling said input port of said non-inverting stage to said input port of said inverting port.

7. Method of reducing phase error of claim 10, in which step (a) comprises providing an inverting field effect transistor, and step (b) comprises providing a non-inverting field effect transistor.

8. Method of reducing phase error comprising:
(a) providing a common gate field effect transistor non-inverting stage having an input port and an output port,
(b) providing a common source field effect transistor inverting stage having an input port and an output port,
(c) coupling said input port of said non-inverting stage to said input port of said inverting stage.

* * * * *